US012609161B2

(12) United States Patent

Hubbard et al.

(10) Patent No.: US 12,609,161 B2

(45) Date of Patent: Apr. 21, 2026

(54) PROGRAMMING ERASE BLOCKS COUPLED TO A SAME STRING

(71) Applicant: Micron Technology, Inc., Boise, ID (US)

(72) Inventors: Daniel J. Hubbard, Boise, ID (US); Kishore K. Muchherla, San Jose, CA (US); Hong Lu, San Jose, CA (US); Xiangang Luo, Fremont, CA (US); Akira Goda, Setagaya (JP)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 18/606,670

(22) Filed: Mar. 15, 2024

(65) Prior Publication Data

US 2024/0311057 A1 Sep. 19, 2024

Related U.S. Application Data

(60) Provisional application No. 63/452,485, filed on Mar. 16, 2023.

(51) Int. Cl.
*G11C 16/10* (2006.01)
*G06F 3/06* (2006.01)

(52) U.S. Cl.
CPC .............. *G11C 16/10* (2013.01); *G06F 3/061* (2013.01); *G06F 3/064* (2013.01); *G06F 3/0679* (2013.01)

(58) Field of Classification Search
CPC ......... G11C 16/10; G06F 3/061; G06F 3/064; G06F 3/0679
See application file for complete search history.

(56) References Cited

U.S. PATENT DOCUMENTS

| 7,177,977 B2 | 2/2007 | Chen |
| 8,542,530 B2 | 9/2013 | Hemink |

(Continued)

FOREIGN PATENT DOCUMENTS

WO 2020005342 1/2020

OTHER PUBLICATIONS

Goda, et al., U.S. Appl. No. 18/386,746, filed Nov. 3, 2023.
Goda, et al., U.S. Appl. No. 18/386,760, filed Nov. 3, 2023.

*Primary Examiner* — Curtis James Kortman
(74) *Attorney, Agent, or Firm* — Brooks, Cameron & Huebsch, PLLC

(57) ABSTRACT

A method can comprise receiving data corresponding to a sequence of write commands to write the data to a memory array comprising a plurality of strings of memory cells. Each string of the plurality of strings comprises: a first group of memory cells coupled to a first group of access lines and corresponding to a first erase block having a first programming characteristic; and a second group of memory cells coupled to a second group of access lines and corresponding to a second erase block having a second programming characteristic. The method can further comprise writing data sequentially to the first erase blocks of the plurality of strings and the second erase blocks of the plurality of strings in an interleaved manner by: writing a first portion of the data to one or more first erase blocks of the plurality of strings; and writing, subsequent to writing the first portion of the data to the one or more first erase blocks, a second portion of the data to one or more second erase blocks of the plurality of strings.

18 Claims, 8 Drawing Sheets

(56)  References Cited

U.S. PATENT DOCUMENTS

| | | | |
|---|---|---|---|
| 9,786,375 B2 | 10/2017 | Goda | |
| 10,229,740 B2 | 3/2019 | Cai | |
| 2012/0023356 A1* | 1/2012 | Byom | G11C 29/021 |
| | | | 713/340 |
| 2015/0012802 A1 | 1/2015 | Avila et al. | |
| 2018/0034485 A1* | 2/2018 | Marelli | G11C 29/028 |
| 2018/0196620 A1* | 7/2018 | Kim | G11C 29/023 |
| 2019/0087128 A1 | 3/2019 | Shin | |
| 2020/0211652 A1 | 7/2020 | Wu et al. | |
| 2021/0132818 A1 | 5/2021 | Hallak et al. | |
| 2021/0405898 A1 | 12/2021 | Bert | |
| 2023/0343395 A1* | 10/2023 | Zhang | G11C 11/5628 |
| 2023/0409236 A1* | 12/2023 | Muthiah | G06F 3/0659 |
| 2024/0055051 A1 | 2/2024 | Yang et al. | |
| 2024/0311262 A1* | 9/2024 | Cao | G06F 11/0751 |

* cited by examiner

SUPER DECK ─815

| LUN0 | | LUN1 | | LUN2 | | LUN3 | |
|---|---|---|---|---|---|---|---|
| *805-1-1* | *805-1-2* | *805-2-1* | *805-2-2* | *805-1-3* | *805-1-4* | *805-2-3* | *805-2-4* |

970⟍

| RECEIVING DATA CORRESPONDING TO A SEQUENCE OF WRITE COMMANDS TO WRITE THE DATA TO A MEMORY ARRAY COMPRISING A PLURALITY OF STRINGS OF MEMORY CELLS |
|---|

─972

| WRITING DATA SEQUENTIALLY TO THE FIRST ERASE BLOCKS OF THE PLURALITY OF STRINGS AND THE SECOND ERASE BLOCKS OF THE PLURALITY OF STRINGS IN AN INTERLEAVED MANNER |
|---|

─974

PROGRAMMING ERASE BLOCKS COUPLED TO A SAME STRING

PRIORITY INFORMATION

This application claims the benefits of U.S. Provisional Application No. 63/452,485, filed on Mar. 16, 2023, the contents of which are incorporated herein by reference.

TECHNICAL FIELD

Embodiments of the disclosure relate generally to memory systems, and more specifically, relate to apparatuses and methods for programming erase blocks coupled to a same string.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
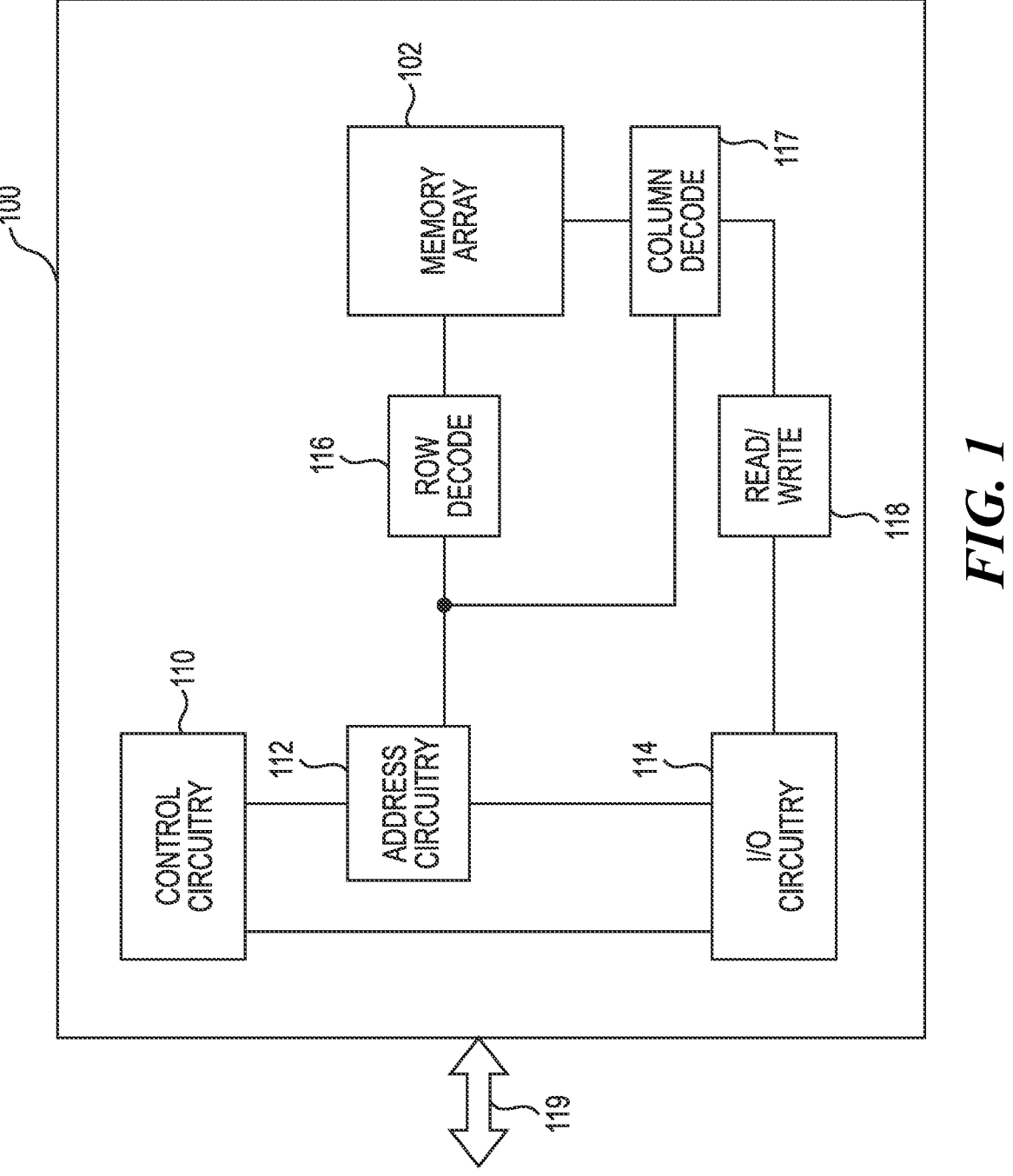
FIG. 1 illustrates an example portion of a memory system including a memory device having and array in accordance with various embodiments of the present disclosure.

Aspects of the present disclosure are directed to apparatuses and methods for programming erase blocks coupled to a same string. Various types of memory, such as NAND flash memory, include a memory array of many memory cells that can be arranged in row and column fashion and grouped in physical blocks. The cells can be floating gate transistors that can be programmed to store one more bits by adding charge to the floating gate. Generally, an erase operation (e.g., a "block erase") is performed to erase all of the cells of a block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings.

A 3D memory array can comprise multiple blocks each comprising a plurality of memory pages (e.g., physical pages of cells than can store one or more logical pages of data). In various previous approaches, a block of memory cells corresponds to a smallest group of memory cells that can be erased. For example, in prior approaches it is not possible to erase some of the memory cells of a block while maintaining data in other memory cells of the block.

Due to various reasons, pages of NAND memory cells can have different programming characteristics depending on geological characteristics of the pages within the NAND memory array. For example, one group of pages located closer to one side of the array (e.g., drain side) can exhibit a relatively slower or faster programming characteristic (e.g., a slower or faster data transfer rate when programming data to the group of pages) than that of the other group of pages located closer to the other side of the array (e.g., source side) depending on, for example, how easily the seed voltage (to provide an initial voltage to the channel/source/ drain region) can be applied in programming the pages. In this example, an unorganized programming behavior on the NAND memory array can often lead to programming data consecutively to those groups of pages of NAND memory cells having a relatively slower programming characteristic, which can result in a worsened system throughput as compared to programming at least portion of the data to those groups of pages of NAND memory cells having a faster programming characteristic.

Various embodiments of the present disclosure address the above and other deficiencies by providing apparatus and methods that can improve performance associated with programming multiple (e.g., different) erase blocks coupled to a same string. Since the programming characteristics of the erase blocks are often different, various embodiments include programming the erase blocks in an interleaved manner, which can provide benefits such as improving average write performance. As used herein, an "erase block" refers to a group of cells that are configured to be erased together as a group and that share a same string as one or more additional groups of cells (e.g., one or more additional erase blocks). An erase block may also be referred to as a "deck." The access to the erase blocks in an interleaved manner can avoid a situation in which erase blocks having a slower programming characteristic are undesirably and consecutively accessed, which can further avoid a situation in which a throughput (e.g., write throughput) of the NAND memory device in a given time interval, which can be 1 second (s) interval, is measured solely based on access time to consecutive/multiple erase blocks having a slower programming characteristic. Therefore, interleaved access to the NAND memory device of the embodiments provides a better throughput (which will be based on an average throughput between erase blocks having relatively slower and faster programming characteristics) in a given time interval (e.g., 1 s interval), which can further provide better results on the tests (e.g., performance benchmark tests) performed on the NAND memory device.

FIG. 1 illustrates an example portion of a memory system including a memory device 100 having and array 102 in accordance with various embodiments of the present disclosure. The memory array 102 can be a 3D NAND array such as described further in association with FIG. 2, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 1090 described in FIG. 10.

The memory device 100 includes control circuitry 110, address circuitry 112, input/output (I/O) circuitry 114 used to communicate with an external device via an interface 119, which may be a bus used to transmit data, address, and control signals, among other signals between the memory device 100 and an external host device, which can include a controller, host processor, etc., that is capable of accessing the memory array 102. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface; however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations, data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof.

The I/O circuitry 114 is used for bi-directional communication of data between the memory array 102 and the external host via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102.

Figure 2:
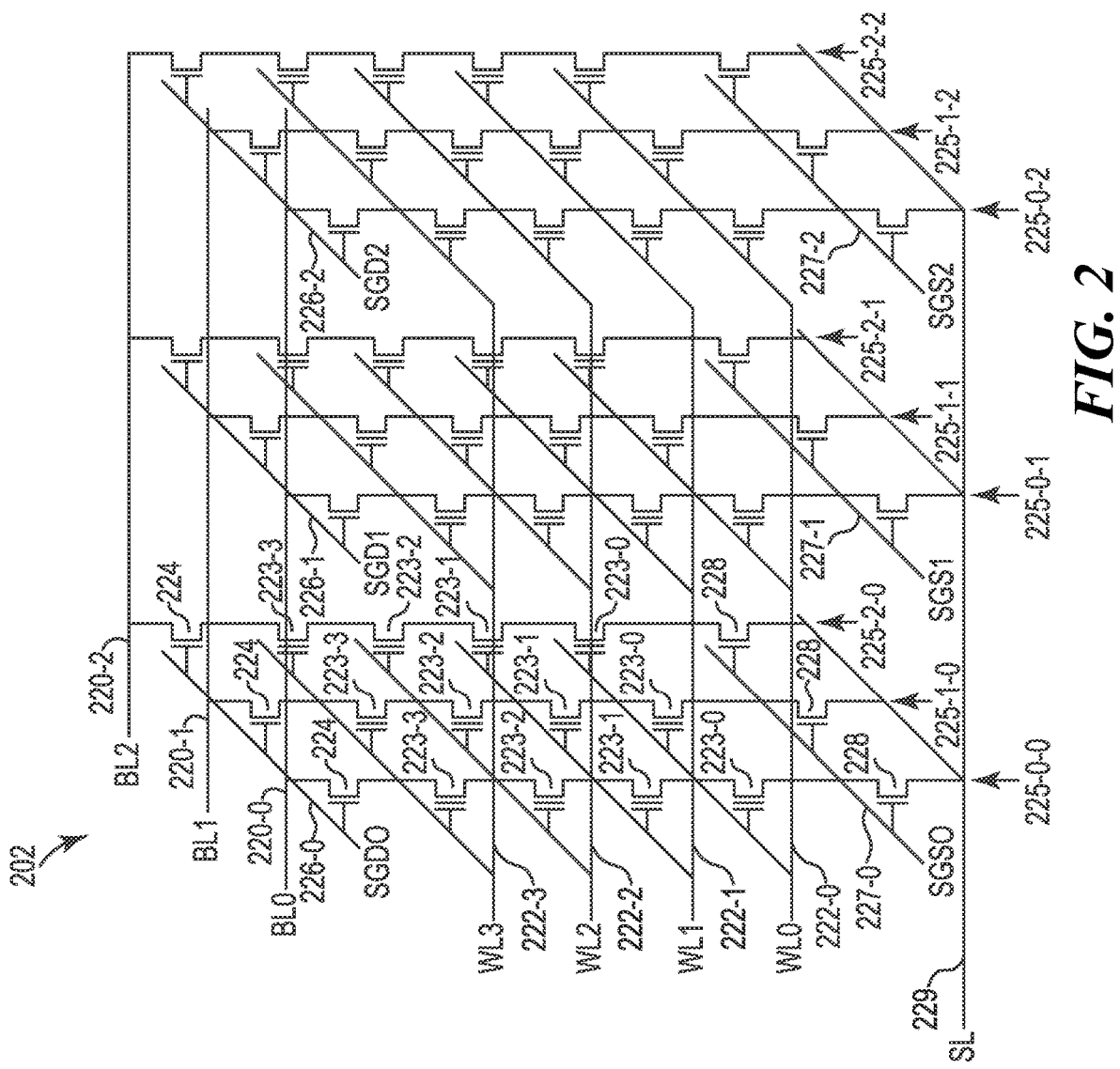
FIG. 2 is a schematic diagram illustrating an example memory array in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 200 is a 3D NAND array.

The memory array 200 comprises a number of access lines (word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The word lines, bit lines, and strings are collectively referred to as word lines 222, bit lines 220, and strings 225, respectively. Although four word lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate transistors with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each word line 222 can be commonly coupled to all the memory cells at a particular tier/level. For example, word line 222-0 can be coupled to (e.g., as the control gate) the nine memory cells 223-0 corresponding to the nine respective strings 225.

The select gate transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages can be applied to the word lines 222, bit lines 220, and source line 229. The particular voltages applied depends on the memory operation being performed, and different voltages may be applied to the word lines 222 during a particular memory operation in order to store data in a cell (or page of cells) or read data from a cell. For example, a write operation to store data in a selected memory cell 223-2 of string 225-0-0 (shown within a dashed circle) selected to store information into memory cell 212 can involve applying a voltage (e.g., a programming voltage) to the word line 222-2 corresponding to the selected cell 223-2 and other voltages to the word lines (222-0, 222-1, and 222-3) coupled to non-selected cells (222-0, 222-1, and 222-4) (e.g., the memory cells not being programmed). An erase operation to remove data from a selected group of memory cells (e.g., a selected erase block as described further below) can include applying a relatively high voltage (e.g., 20V) to the source line 229, the relatively high voltage (e.g., 20V) to unselected word lines (e.g., word lines coupled to cells of an erase block not being erased), and a relatively low voltage (e.g., 0V) to the selected word lines (e.g., the word lines coupled to the erase block being erased), which results in erasing of the cells of the selected erase block by removing charge from their floating gates and thereby reducing their Vt levels to near 0V, for example.

Figure 3:
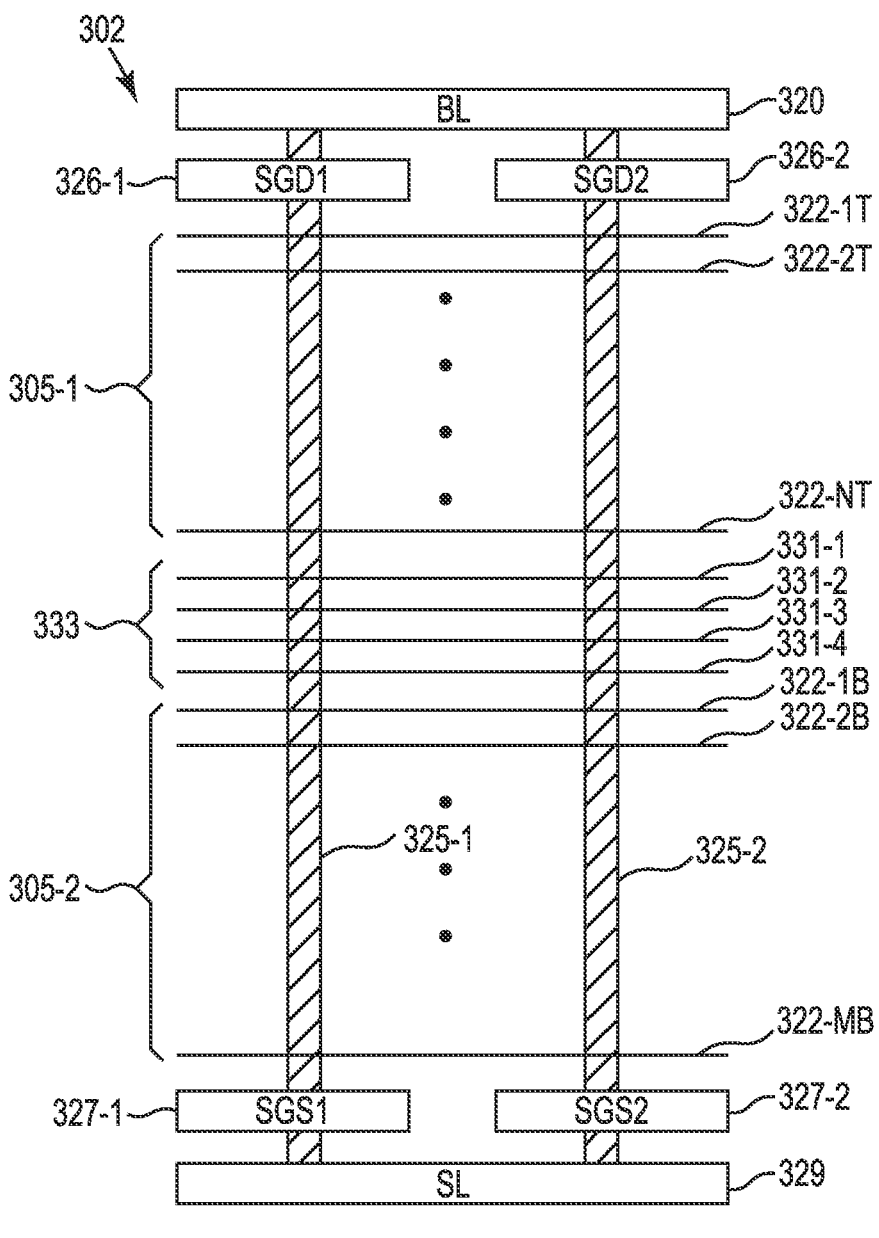
FIG. 3 schematically illustrates a portion of a memory array having multiple erase blocks per string in accordance with various embodiments of the present disclosure.

As described further in FIG. 3, the memory cells 223 of the array 202 can represent a physical block of memory cells that can comprise multiple (e.g., two or more) physical erase blocks. As an example, the word lines 222-0 and 222-1 can be coupled to cells of a first erase block, and the word lines 222-2 and 222-3 can be coupled to cells of a second/different erase block. Therefore, the cells 223-0 and 223-1 of the nine respective strings 225 (e.g., the cells of the first erase block) share respective common strings with the cells 223-2 and 223-3 (e.g., the cells of the second erase block).

As further described herein, an array (e.g., 202) can comprise a number of word lines physically between (e.g., separating) the word lines (e.g., 222) corresponding to different erase blocks. The word lines separating word lines corresponding to different erase blocks can be referred to as "dummy" word lines and can be coupled to dummy memory cells (e.g., within the strings 225) that are not used to store data. The dummy word lines and/or dummy cells can facilitate the ability to perform erase operations separately on erase blocks that share a common string or strings. The quantity of dummy word lines between erase blocks can vary, and various bias voltages can be applied to the dummy word lines during the various memory operations performed on the erase blocks.

In operation, erase blocks can be separately (e.g., individually) selected or deselected. For example, an erase operation can be performed on a selected first erase block corresponding to a group of strings while other erase block(s) corresponding to the same group of strings is deselected (e.g., such that is not erased).

FIG. 3 schematically illustrates a portion of a memory array 302 having multiple erase blocks per string in accordance with various embodiments of the present disclosure. The example shown can be a portion of the array 202 described in FIG. 2. The array portion 302 can be a portion of a physical block of memory cells that includes multiple erase blocks (e.g., decks).

In this example, the array 302 includes a plurality/group of word lines 322-1T, 322-2T, . . . , 322-NT corresponding to a first erase block 305-1 (e.g., a top deck) and a plurality/group of word lines 322-1B, 322-2B, . . . , 322-MB corresponding to a second erase block 305-2 (e.g., bottom deck). The designators "N" and "M" can represent various numbers (e.g., 3 or more) and "N" and "M" can be the same number. Accordingly, embodiments are not limited to a particular quantity of word lines 322 for the top deck 305-1 or bottom deck 305-2 (the designator "T" corresponding to "top" and the designator "B" corresponding to "bottom"). The array 302 also includes a number of dummy word lines 331-1, 331-2, 331-3, and 331-4, which can be collectively referred to as word lines 331. The dummy word lines 331 correspond to a separation region 333 between the top deck 305-1 and bottom deck 305-2. Although four word lines 331 are illustrated, embodiments can include more or fewer than four dummy word lines 331 separating erase blocks corresponding to same strings.

The array portion 304 illustrates two strings 325-1 and 325-2 for case of illustration; however, embodiments can include many more strings 325. Memory cells are located at the intersections of the word lines 322/331 and strings 325, with the memory cells of a particular string 325 sharing a common channel region (e.g., pillar) as described in FIG. 2. The dummy word lines 331 can be coupled to dummy memory cells (e.g., cells that are not addressable to store user data).

As illustrated in FIG. 3, a first end of the strings 325-1 and 325-2 can be coupled to a common source line 329 via respective select gate source lines 327-1 (SGS1) and 327-2 (SGS2). The second/opposite end of the strings 325-1 and 325-2 can be coupled to a bit line 320 via respective select gate drain lines 326-1 (SGD1) and 326-2 (SGD2). As such, the strings 325 (e.g., the cells thereof) can be individually accessed using the bit line 320 and select gates to which the lines 326-1 and 326-2 are coupled. Although only a single bit line 320 is shown, embodiments can include multiple bit lines such as shown in FIG. 2, for example.

As noted herein, in various embodiments, the top deck 305-1 and the bottom deck 305-2 can be erased via separate erase operations even though the cells of the decks 305-1/305-2 share the same strings 325-1/325-2. For example, an erase operation can be performed on the cells coupled to word lines 322-1T to 322-NT without erasing the cells coupled to the word lines 322-1B to 322-MB, and vice versa. Similarly, each one of the decks 305-1 and 305-2 can be individually programmed and/or read without programming or reading the other of the decks 305-1 and 305-2. An erase operation performed on a selected deck 305-1, for example, can include applying relatively low voltages to the selected word lines 322-1T to 322-NT, while applying relatively high voltages to the word lines 322-1B to 322-1M of the unselected deck 305-2.

For example, programming the top deck 305-1 located closer to the SGS1 326-1 and/or SGS2 326-2 can involve applying the seed voltage through the SGD1 and/or SGD2, which can be relatively easily done if the bottom deck 305-2 is in an erased state. However, if at least a portion (e.g., one or more pages) of the bottom deck 305-2 is already programmed, programming the top deck 305-1 by applying the seed voltage through the SGD1 and/or SGD2 may be challenging since the seed voltage via this route would have to pass those pages of memory cells of the bottom deck 305-2 that are already programmed, which can adversely affect those already-programmed pages of the bottom deck 305-2. Even if the seed voltage is allowed to be applied via either side (e.g., from select gate source and/or from select gate drain) of the strings 325 (e.g., to sequentially program pages of the top deck 305-1 sequentially in a direction from the SGS1 or SGS2 and toward the region 333 or pages of the bottom deck 305-1 in a direction from the region 333 and toward the SGD1 or SGD2), an adverse effect (e.g., undesirably higher read window budget (RWB)) due to the cell-to-cell interference can be worsened on either top deck 305-1 or bottom deck 305-2. Therefore, due to the above reasons, one erase block (e.g., a top deck 305-1) can generally have a different programming characteristic than that of the other erase block (e.g., a bottom deck 305-2), such as a slower data transfer rate and/or longer programming time (e.g., time elapsed to program data to the memory cells).

Figure 4:
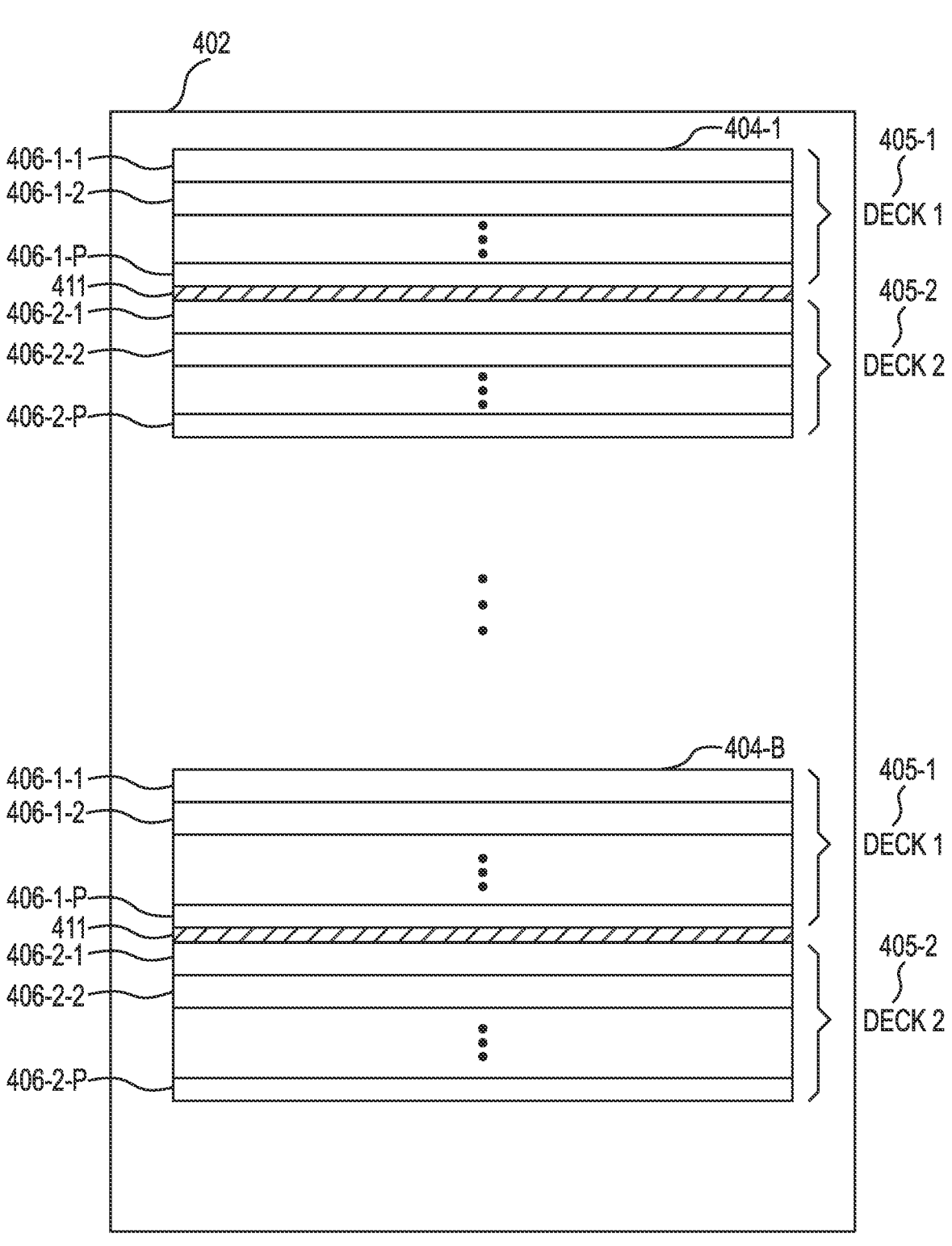
FIG. 4 illustrates a portion of a memory array having multiple erase blocks per string in accordance with various embodiments of the present disclosure.

FIG. 4 illustrates a portion of a memory array 402 having multiple erase blocks per string in accordance with various embodiments of the present disclosure. The memory array 402 includes multiple physical blocks 404-1, . . . , 404-B and can be operated in accordance with one or more embodiments of the present disclosure. The indicator "B" is used to indicate that the array 402 can include a number of physical blocks 404. As an example, the number of physical blocks in array 402 can be 128 blocks, 512 blocks, or 1,024 blocks, but embodiments are not limited to a particular multiple of 128 or to any particular number of physical blocks in an array 402. The memory array 402 can be, for example, a NAND flash memory array (e.g., a 3D NAND flash array such as array 102, 202, and/or 302).

Each of the physical blocks 404-1, . . . , 404-B includes a first erase block 405-1 (DECK_1) and a second erase block 405-2 (DECK_2) separated by a region 411, which can correspond to a region of dummy word lines such as word lines 331 shown in FIG. 3. As described above, the decks 405-1 and 405-2 are commonly coupled to the strings of the blocks 404-1, . . . , 404-B with the decks 405-1 and 405-2 being separately erasable via a block erase operation (e.g., deck 405-1 can be erased without erasing deck 405-2 and vice versa).

Each deck 405-1 and 405-2 can comprise a number of physical pages, which can correspond to a "row" of the array corresponding to a particular word line. As shown, deck 405-1 comprises pages 406-1-1, 406-1-2, . . . , 406-1-P, and deck 405-2 comprises pages 406-2-1, 406-2-2, . . . , 406-2-P. The designator "P" is used to indicate that the decks 405-1 and 405-2 can comprise a plurality of pages/rows. Each physical page (collectively referred to as pages 406) can store multiple logical pages of data. A page can refer to a unit of programming and/or reading (e.g., a group of cells that are programmed and/or read together as a functional group).

Figure 5:
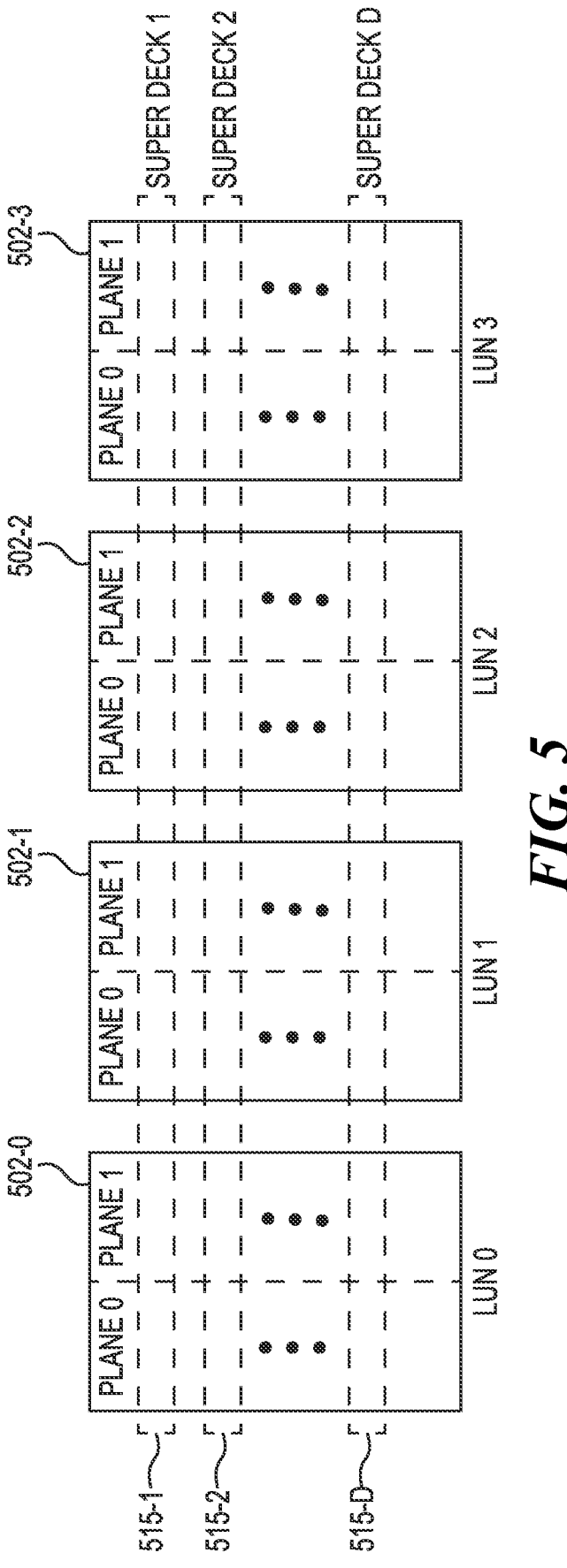
FIG. 5 illustrates a portion of a memory device having multiple erase blocks per string in accordance with various embodiments of the present disclosure.

FIG. 5 illustrates a portion of a memory device having multiple erase blocks per string in accordance with various embodiments of the present disclosure. In various embodiments, the physical blocks of a memory array can be organized into planes. For example, FIG. 5 illustrates memory arrays 502-0, 502-1, 502-3, and 502-4 each divided into a first plane (PLANE 0) of physical blocks and a second plane (PLANE 1) of physical blocks. Embodiments are not limited to a particular quantity of planes per array. Each array 502-0, 502-1, 502-3, and 502-4 corresponds to a respective logical unit (LUN) LUN0, LUN1, LUN2, and LUN3. Each LUN can correspond to a different memory device (e.g., memory device 100 shown in FIG. 1); however, embodiments are not so limited. For example, a memory device (e.g., die) can include multiple LUNs. A LUN can, for example, correspond to a smallest unit that can independently execute commands and report status.

The physical blocks of the planes can comprise multiple erase blocks sharing common strings as described herein. The physical blocks can be grouped into "super blocks" with each super block comprising a physical block from each plane (e.g., PLANE 0 and PLANE 1) across multiple LUNs (e.g., across multiple arrays 502). Similarly, embodiments of the present disclosure can include a number of super decks 515-1 (SUPER DECK_1), 515-2 (SUPER DECK_2), . . . , 515-D (SUPER DECK_D). Each super deck (alternatively referred to as "super erase block") 515 can comprise a deck from each plane across multiple LUNs. For example, a first super deck 515-1 (SUPER DECK_1) can comprise a deck from plane 0 of LUN0, a deck from plane 1 of LUN0, a deck from plane 0 of LUN1, a deck from plane 1 of LUN1, a deck from plane 0 of LUN2, a deck from plane 1 of LUN2, a deck from plane 0 of LUN3, and a deck from plane 1 of LUN3. As further illustrated in association with FIG. 8, each super deck can include top (e.g., top deck 350-1 illustrated in FIG. 3) and bottom (e.g., bottom deck 350-2 illustrated in FIG. 3) decks in an interleaved manner over LUNs. For example, a super deck 515-1 can comprise "top" decks of LUN0, "bottom" decks of LUN 1, "top" decks of LUN2, and "bottom" decks of LUN 3. Similarly, a super deck 515-2 can comprise "bottom" decks of LUN0, "top" decks of LUN 1, "bottom" decks of LUN2, and "top" decks of LUN 3, although embodiments are not so limited.

Figure 6:
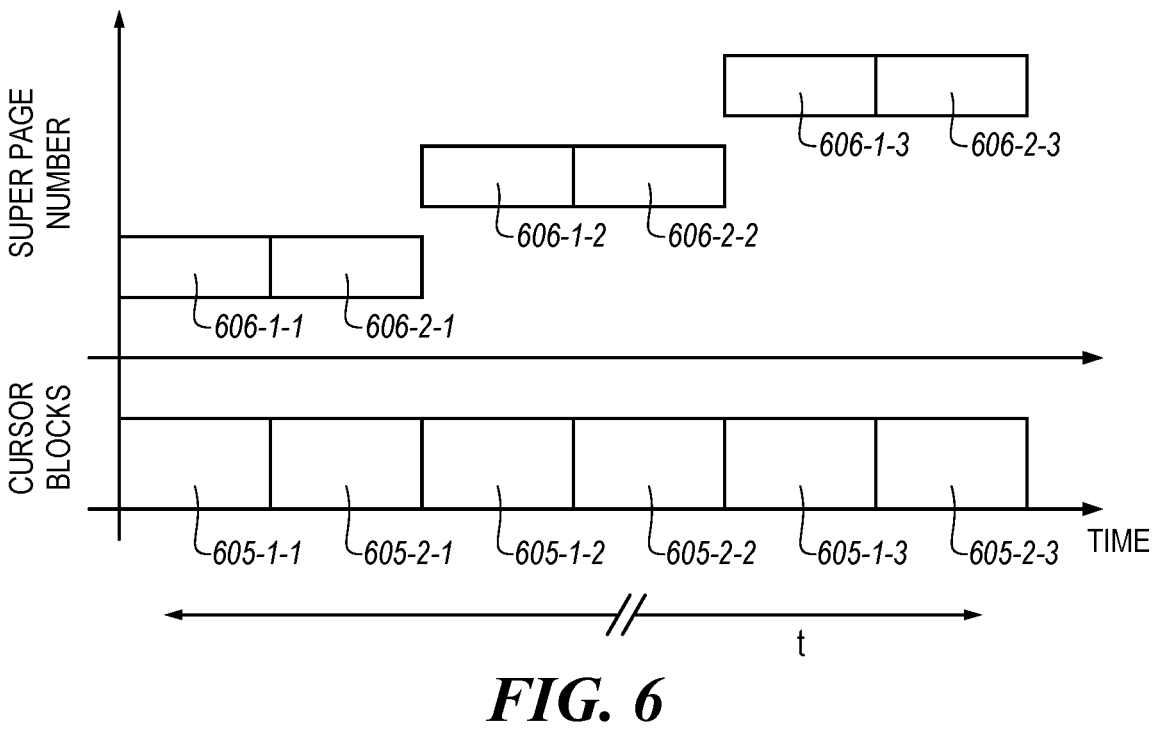
FIG. 6 is a diagram that illustrates executing a sequence of write commands on erase blocks having different programming characteristics in an interleaved manner in accordance with various embodiments of the present disclosure.

FIG. 6 is a diagram that illustrates executing a sequence of write commands on erase blocks having different programming characteristics in an interleaved manner in accordance with various embodiments of the present disclosure. Pages 606-1-1, 606-1-2, 606-1-3 illustrated in FIG. 6 can be pages of one or more first erase blocks 605-1-1, 605-1-2, 605-1-3 (collectively referred to as first erase blocks 605-1), which can correspond to "top" erase block 305-1, 405-1 illustrated in FIGS. 3-4, while pages 606-2-1, 606-2-2, 606-2-3 illustrated in FIG. 6 can be pages of one or more second erase block 605-2-1, 605-2-2, 605-2-3 (collectively referred to as second erase blocks 605-2), which can correspond to a "bottom" erase block 305-2 and/or 405-2 illustrated in FIGS. 3-4. As described herein, these top and bottom erase blocks may generally have different programming characteristics due to the reasons stated above. For example, top erase blocks may have a different programming characteristic (e.g., faster or slower data transfer rate) than that of bottom erase blocks.

The sequence of write commands can be sequentially executed such that data corresponding to the sequence of write commands are written sequentially to first (e.g., top) and second (e.g., bottom) erase blocks in an interleaved manner. For example, as illustrated in FIG. 6, the sequence of write commands can be executed by writing data (corresponding to the sequence of write commands) firstly to a first page 606-1-1 (e.g., page "0") of the first erase block 605-1-1. When the first page 606-1-1 is written with the data, the execution of the sequence of write commands can be continued by writing data subsequently a first page 606-2-1 (e.g., page "0") of the second erase block 605-2-1 (that is located in a different physical block than the first erase block 605-1-1). Similarly and subsequently, the sequence of write commands can be executed by writing data sequentially to a first page 606-1-2 (e.g., as page "0") of the first erase block 605-1-2 (that is located in a different physical block than the second erase block 605-2-1), a first page 606-2-2 (e.g., page "0") of the second erase block 605-2-2 (that is located in a different physical block than the first erase block 605-1-2), a first page 606-1-3 (e.g., page "0") of the first erase block 605-1-3 (that is located in a different physical block than the second erase block 605-2-2), a first page 606-2-3 (e.g., page "2") of the second erase block 605-2-3 (that is located in a different physical block than the first erase block 605-1-3).

Although embodiments are not so limited, pages 606-1-1, 606-1-2, 606-1-3 can correspond to one super page (of one super block, such as super block 515 illustrated in FIG. 5), while pages 606-2-1, 606-2-2, 606-2-3 correspond to another super page (of another super block). For example, one super page can include pages 606-1-1, 606-1-2, 606-1-3 respectively from first erase blocks 605-1-1, 605-1-2, 605-1-3, another super page can include pages 606-2-1, 606-2-2, 606-2-3 respectively from first erase blocks 605-2-1, 605-2-2, 605-2-3. Accordingly, in this example where the data corresponding to the sequence of write commands as described above, the data is written to two different super pages in an interleaved manner.

Writes operations corresponding to the sequence of write commands and as illustrated in FIG. 6 can be performed using multiple write cursors, such as two write cursors, which can respectively indicate the progress of write operations in the first and second erase blocks 605-1 and 605-2 (e.g., corresponding to two super pages). For example, once the sequence of write commands are received, the controller (e.g., the controller 108 illustrated in FIG. 1) can generate one write cursor to open the first erase block 605-1 and another write cursor to open the second erase block 605-2. As the sequence of write commands are being executed on the first and second erase blocks 605-1 and 605-2, these write cursors can be updated to track the progress of the write operations respectively on the first and second erase blocks 605-1 and 605-2. These two write cursors can be operated simultaneously as the write operations are being performed. For example, both write cursors can be open while the sequence of write commands are being executed on the first and second erase blocks 605-1 and 605-2.

Figure 7:
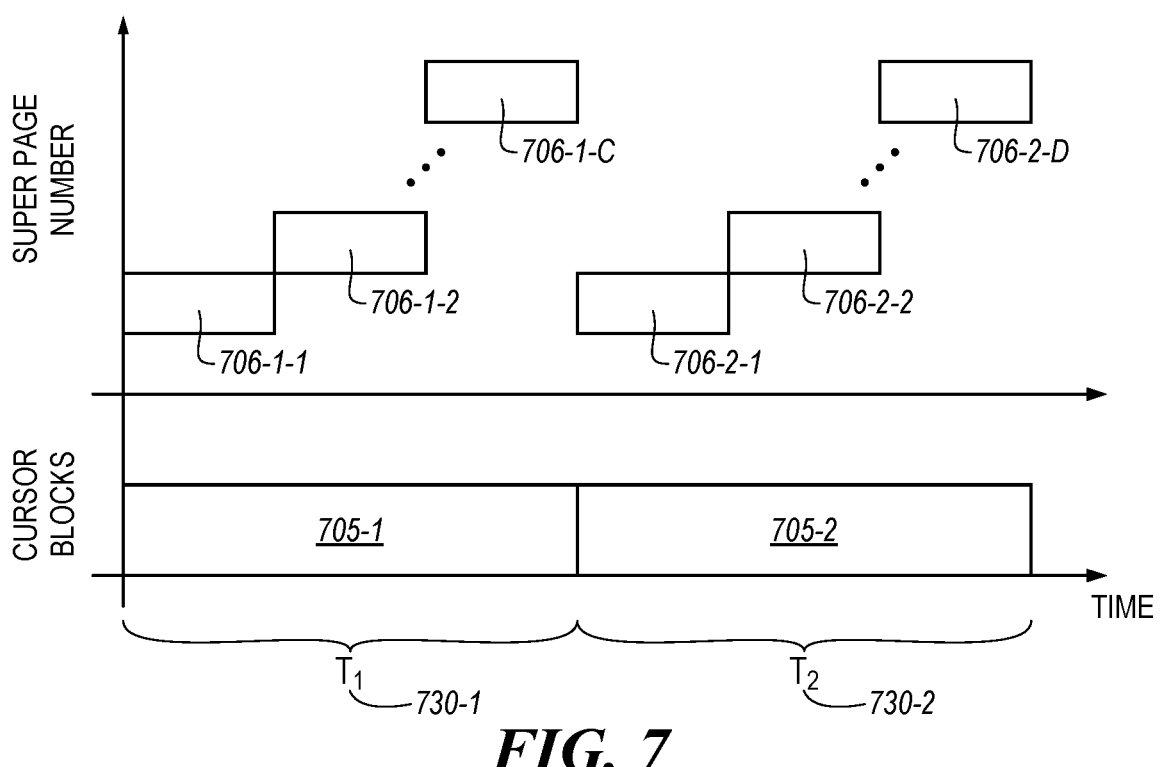
FIG. 7 is another diagram that illustrates executing a sequence of write commands on erase blocks having different programming characteristics in an interleaved manner in accordance with various embodiments of the present disclosure.

FIG. 7 is another diagram that illustrates executing a sequence of write commands on erase blocks 705-1, 705-2 having different programming characteristics in an interleaved manner in accordance with various embodiments of the present disclosure. A first erase block 705-1 can correspond to one or more "top" decks 305-1 illustrated in FIG. 3 (that is closer to the SGD1 326-1 or SGD2 326-2 illustrated in FIG. 3 than the bottom deck 305-2), while a second erase block 705-2 can correspond to one or more "bottom" decks 305-2 illustrated in FIG. 3 (that is closer to the SGS1 327-1 or SGS2 327-2 illustrated in FIG. 3 than the bottom deck 305-2). As described herein, these top and bottom erase blocks may have different programming characteristics due to the reasons stated above. For example, top erase blocks may generally have a different programming characteristic (e.g., faster or slower data transfer rate) than that of bottom erase blocks.

Each super page 706-1 (e.g., super page 706-1-1, 706-1-2, . . . , 706-1-C) can comprises physical pages (e.g., pages 406 illustrated in FIG. 4) respectively from multiple top erase blocks, while each super page 706-2 (e.g., super page 706-2-1, 706-2-2, . . . , 706-2-D) can comprises physical pages (e.g., pages 406 illustrated in FIG. 4) respectively from multiple bottom erase blocks. Therefore, in this example, the erase block 705-1 can represent multiple top decks that form one or more super block respectively having super pages 706-1-1, 706-1-2, . . . , 706-1-C, while the erase block 705-2 can represent multiple bottom decks that form one or more super block respectively having super pages 706-2-1, 706-2-2, . . . , 706-1-D.

The sequence of write commands can be sequentially executed such that data corresponding to the sequence of write commands are written sequentially to first (e.g., top) and second (e.g., bottom) erase blocks in an interleaved manner. For example, as illustrated in FIG. 7, the sequence of write commands can be executed by writing data (corresponding to the sequence of write commands) sequentially to super pages 706-1-1, . . . , 706-1-C of the first erase block 706-1 over a time period 730-1 (e.g., until the time period 730-1 becomes expired). When the time period 730-1 is expired, the execution of the sequence of write commands can be continued by writing subsequent and/or remaining data (corresponding to the sequence of write commands) subsequently and sequentially to super pages 706-2-1, . . . , 706-2-D of the second erase block 706-2 over a time period 730-2 (e.g., until the time period 730-2 becomes expired). Although embodiments are not so limited, an amount of time corresponding to the time period 730-1 can be equal to an amount of time corresponding to the time period 730-2. For example, the time period 730-1 and 730-2 can each correspond to ½ second.

Writes operations corresponding to the sequence of write commands and as illustrated in FIG. 7 can be performed using multiple write cursors, such as two write cursors, which can respectively indicate the progress of write operations in the first and second erase blocks 705-1 and 705-2. For example, once the sequence of write commands are received, the controller (e.g., the controller 108 illustrated in FIG. 1) can generate one write cursor to open the first erase block 705-1 and another write cursor to open the second erase block 705-2. As the sequence of write commands are being executed on the first and second erase blocks 705-1 and 705-2, these write cursors can be updated to track the progress of the write operations respectively on the first and second erase blocks 705-1 and 705-2. These two write cursors can be operated one at a time as the write operations are being performed. For example, during the time period 730-1, the write cursor for the first erase block 705-1 can be open (to open the first erase block 705-1), while the write cursor for the second erase block 705-2 is inactive. Further, during the time period 730-2, the write cursor for the first erase block 705-2 can be open (to open the first erase block 705-2), while the write cursor for the second erase block 705-1 is inactive.

Figures 8, 9:
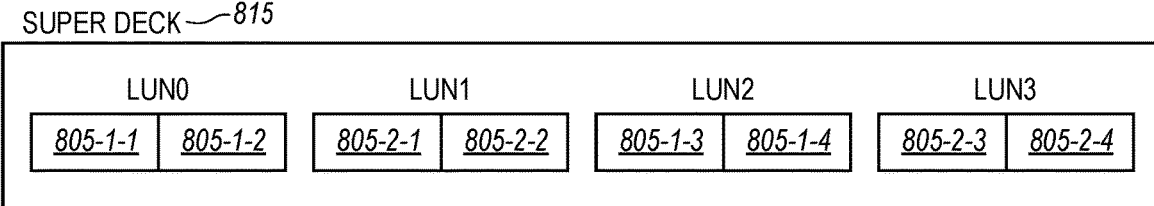
FIG. 8 illustrates an example super erase block having erase blocks having different programming characteristics from multiple logical units (LUNs) in an interleaved manner in accordance with various embodiments of the present disclosure.
FIG. 9 is a flow diagram that illustrates an example method for accessing erase blocks having different programming characteristics in an interleaved manner in accordance with various embodiments of the present disclosure.

FIG. 8 illustrates an example super erase block (alternatively referred to as "super deck") having erase blocks having different programming characteristics from multiple logical units (LUNs) in an interleaved manner in accordance with various embodiments of the present disclosure. First erase blocks 805-1-1, 805-1-2, 805-1-3, 805-1-4 (collectively referred to as first eraser blocks 805-1) can each correspond to a "top" deck 305-1 illustrated in FIG. 3 (that is closer to the SGD1 326-1 or SGD2 326-2 illustrated in FIG. 3 than the bottom deck 305-2), while second erase blocks 805-2-1, 805-2-2, 805-2-3, 805-2-4 (collectively referred to as first eraser blocks 805-2) can each correspond to a "bottom" deck 305-2 illustrated in FIG. 3 (that is closer to the SGS1 327-1 or SGS2 327-2 illustrated in FIG. 3 than the bottom deck 305-2). As described herein, these top and bottom erase blocks 805 may have different programming characteristics due to the reasons stated above. For example, top erase blocks 805-1 may generally have a different programming characteristic (e.g., faster or slower data transfer rate) than that of bottom erase blocks 805-2. Although FIG. 8 illustrates the super erase block 815 as including eight erase blocks (e.g., erase blocks 805-1-1, 805-1-2, 805-1-3, 805-1-4, 805-2-1, 805-2-2, 805-2-3, 805-2-4), embodiments are not limited to a particular quantity of erase blocks a super erase block can include.

FIG. 8 illustrates the super erase block 815 as including first and second erase blocks 805-1 and 805-2 in an interleaved manner. For example, the super erase block 815 is illustrated as including first erase blocks 805-1-1, 805-1-2 of (e.g., from) a LUN0, second erase blocks 805-2-1, 805-2-2 of a LUN1, first erase blocks 805-1-3, 805-1-4 of a LUN2, and second erase blocks 805-2-3, 805-2-4 of a LUN3. Therefore, one super page of the super erase block 815 can include a respective page from each one of first erase blocks 805-1-1, 805-1-2, 805-1-3, 805-1-4 and second erase blocks 805-2-1, 805-2-2, 805-2-3, 805-2-4. In this example, writing data to a super page of the super erase block 815 can be performed by writing the data sequentially to respective pages of first erase blocks 805-1-1, 805-1-2, respective pages of second erase blocks 805-2-1, 805-2-2, respective pages of first erase blocks 805-1-3, 805-1-4, and respective pages of second erase blocks 805-2-3, 805-2-4.

Although embodiments are not so limited, erase blocks of each LUN (LUN 0, LUN 1, LUN 2, LUN 3) can be included in different planes. For example, the first erase block 805-1-1 can be included in a plane 0 of LUN 0, while the second erase block 805-2-1 can be included in a plane 1 of LUN 0; the first erase block 805-1-2 can be included in a plane 0 of LUN 1, while the second erase block 805-2-2 can be included in a plane 1 of LUN 1; the first erase block 805-1-3 can be included in a plane 0 of LUN 2, while the second erase block 805-2-3 can be included in a plane 1 of LUN 2; and the first erase block 805-1-4 can be included in a plane 0 of LUN 3, while the second erase block 805-2-4 can be included in a plane 1 of LUN 3.

Writes operations corresponding to the sequence of write commands and as illustrated in FIG. 8 can be performed using multiple write cursors, which can respectively indicate the progress of write operations in the first erase blocks 805-1-1, 805-1-2, 805-1-3, 805-1-4 and second erase blocks 805-2-1, 805-2-2, 805-2-3, 805-2-4. For example, once the sequence of write commands are received, the controller (e.g., the controller 108 illustrated in FIG. 1) can generate eight write cursors to open the first erase blocks 805-1-1, 805-1-2, 805-1-3, 805-1-4 and second erase blocks 805-2-1, 805-2-2, 805-2-3, 805-2-4. As the sequence of write commands are being executed on the first and second erase blocks 805-1 and 805-2, these write cursors can be updated to track the progress of the write operations respectively on the first and second erase blocks 805-1 and 805-2. These two write cursors can be operated one at a time as the write operations are being performed. For example, each write cursor can be sequentially open to perform a corresponding write operation on a respective one of the first and second erase blocks 805-1 and 805-2, while the other write cursors for the other (e.g., idle) erase blocks 805-1 and 805-2 are/remain inactive.

FIG. 9 is a flow diagram that illustrates an example method 970 for accessing erase blocks having different programming characteristics in an interleaved manner in accordance with various embodiments of the present disclosure. The method 970 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 970 is performed by the control circuitry 110 of FIG. 1 and/or the controller 1091 of FIG. 10. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 972, the method 970 includes receiving data corresponding to a sequence of write commands to write the data to a memory array (e.g., memory array 102, 202, 302, 402, 502 illustrated in FIGS. 1-5) comprising a plurality of strings of memory cells (e.g., strings 225, 325 illustrated in FIGS. 2-3). Each string of the plurality of strings can include a first group of memory cells coupled to a first group of access lines (e.g., word lines 322-1T, 322-2T, . . . , 322-NT illustrated in FIG. 3) and corresponding to a first erase block (e.g., top deck 305-1, 405-1, 605-1, 705-1, 805-1 illustrated in FIGS. 3-4 and 6-8) having a first programming characteristic and a second group of memory cells coupled to a second group of access lines (e.g., word lines 322-1B, 322-2B, . . . , 322-MB illustrated in FIG. 3) and corresponding to a second erase block (e.g., bottom decks 305-2, 405-2, 605-2, 705-2, 805-2 illustrated in FIGS. 3-4 and 6-8) having a second programming characteristic.

At block 974, the method 970 further includes writing data sequentially to the first erase blocks of the plurality of strings and the second erase blocks of the plurality of strings in an interleaved manner. This can be done by writing a first portion of the data to one or more first erase blocks of the plurality of strings and writing, subsequent to writing the first portion of the data to the one or more first erase blocks, a second portion of the data to one or more second erase blocks of the plurality of strings.

In some embodiments, writing the first portion of the data to the one or more first erase blocks of the plurality of strings further can further include writing the first portion of the data to a first page (e.g., page 606-1-1 illustrated in FIG. 6) of the one or more first erase blocks. Further, writing the second portion of the data to the one or more second erase blocks of the plurality of strings can further include writing, subsequent to writing the first portion of the data to the first page of the one or more first erase blocks, the second portion of the data to a first page (e.g., page 606-2-1 illustrated in FIG. 6) of the one or more second erase blocks.

Continuing with this example, the first page of the one or more first erase blocks and the first page of the one or more second erase blocks can correspond to a super page of a first super block (e.g., super deck 515, 815 illustrated in FIGS. 5 and 8) whose constituent pages are distributed among a plurality of erase blocks (e.g., first erase blocks 805-1 and second erase blocks 805-2 illustrated in FIG. 8) of the memory array. Further, the method 970 can further include writing, subsequent to writing the second portion of the data to the second page of the one or more second erase blocks, a third portion of the data to a second page of the one or more first erase blocks.

In some embodiments, the method 970 can further include writing the first portion of the data to the one or more first erase blocks over a first time period (e.g., time period 730-1 illustrated in FIG. 7) and writing, responsive to the first time period being expired and to continue to write the data to the memory array, the second portion of the data to the one or more second erase blocks over a second time period (e.g., time period 730-2 illustrated in FIG. 7). Continuing with this example, the method 970 can further include writing, responsive to the second time period being expired, a third portion of the data to the one or more first erase blocks.

Figure 10:
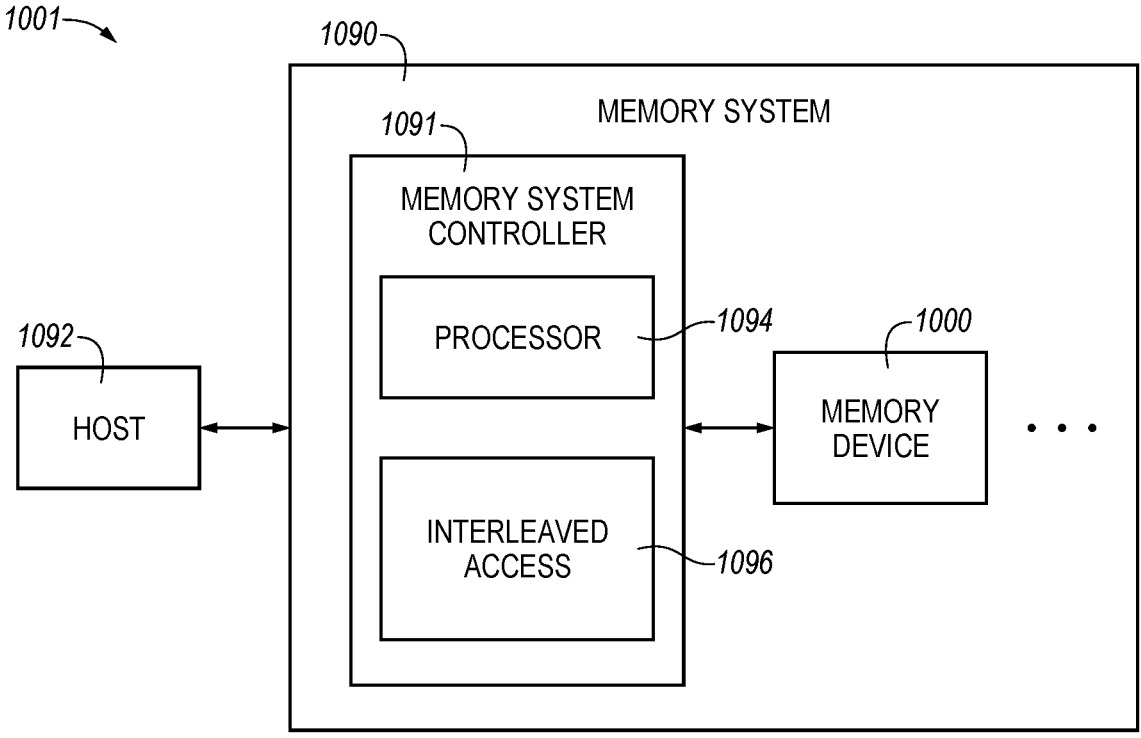
FIG. 10 illustrates an example computing system having a memory system for accessing erase blocks having different programming characteristics in an interleaved manner in accordance with various embodiments of the present disclosure.

FIG. 10 illustrates an example computing system 1001 having a memory system 1090 for performing disturb tracking among multiple erase blocks coupled to a same string in accordance with various embodiments of the present disclosure. As shown in FIG. 10, the memory system 1090 includes a system controller 1091 and a number of memory devices 1000, which can be memory devices such as device 100 described in FIG. 1 (e.g., memory devices comprising memory arrays having multiple erase blocks coupled to common strings).

In some embodiments, the memory system 1090 is a storage system. An example of a storage system is a solid-state drive (SSD). In some embodiments, the memory system 1090 is a hybrid memory/storage sub-system. In general, the computing environment shown in FIG. 10 can include a host system 1092 that uses the memory system 1090. For example, the host system 1092 can write data to the memory system 1090 and read data from the memory system 1090.

The memory system controller 1091 (hereinafter referred to as "controller") can communicate with the memory devices 1000 to perform operations such as reading data, writing data, or erasing data at the memory devices 1000 and other such operations. The controller 1091 can include hardware such as one or more integrated circuits and/or discrete components, a buffer memory, or a combination thereof. The controller 1091 can include a microcontroller, special purpose logic circuitry (e.g., a field programmable gate array (FPGA), an application specific integrated circuit (ASIC), etc.), or other suitable processing circuitry. The controller 1091 can include a processing device (e.g., processor 1094) configured to execute instructions stored in local memory (not shown).

In this example, the controller 1091 includes an interleaved access component 1096 that can be responsible for accessing erase blocks having different programming characteristics (e.g., top and bottom decks) in an interleaved manner as described herein. For example, the interleaved access component 1096 can continue writing data corresponding to a sequence of write commands on a bottom deck (or top deck, alternatively) subsequent to writing data corresponding to the sequence of write commands on one or more pages of a top deck (or bottom deck, alternatively) as illustrated/described in connection with FIG. 6. For example, the interleaved access component 1096 can write data corresponding to a sequence of write commands on one or more pages of a top deck (or bottom deck, alternatively) over a first time period and can continue writing data corresponding to the sequence of write commands on one or more pages of a bottom deck (a top deck, alternatively) over a second time period as illustrated/described in connection with FIG. 7. For example, the interleaved access component 1096 can write data corresponding to a sequence of write commands on one or more super pages of a super block that includes pages from top and bottom deck of LUNs in an interleaved manner as illustrated/described in connection with FIG. 8.

In general, the controller 1091 can receive commands or operations from the host system 1092 and can convert the commands or operations into instructions or appropriate commands to achieve the desired access to the memory devices 1000. The controller 1091 can be responsible for other operations such as wear leveling operations, garbage collection operations, error detection and error-correcting code (ECC) operations, encryption operations, caching operations, and address translations between a logical block address and a physical block address that are associated with the memory devices 1000.

The host system 1092 can be a computing device such as a desktop computer, laptop computer, network server, mobile device, or other such computing device that includes a memory and a processing device. The host system 1092 can include, or be coupled to, the memory system 1090 so that the host system 1092 can read data from or write data to the memory system 1090. The host system 1092 can be coupled to the memory system 1090 via a physical host interface (not shown in FIG. 10). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 1092 and the memory system 1090. The host system 1092 can further utilize an NVM Express (NVMe) interface to access the memory devices 1000 when the memory system 1090 is coupled with the host system 1092 by the PCIe interface. The physical host interface can provide an interface for passing control, address, data, and other signals between the memory system 1090 and the host system 1092.

While the example memory system 1090 in FIG. 10 has been illustrated as including the controller 1091, in another embodiment of the present disclosure, a memory system 1090 may not include a controller 1091, and can instead rely upon external control (e.g., provided by a processor or controller separate from the memory system 1090, such as by host 1092 communicating directly with the memory devices 1000).

Although the memory system 1090 is shown as physically separate from the host 1092, in a number of embodiments the memory system 1090 can be embedded within the host 1092. Alternatively, the memory system 1090 can be removable from the host 1092.

As used herein, an "apparatus" can refer to various structural components. For example, the computing system 1001 shown in FIG. 10 can be considered an apparatus. Alternatively, the host 1092, the controller 704, and the memory device 1000 might each separately be considered an apparatus.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   receiving data corresponding to a sequence of write commands to write the data to a memory array comprising a plurality of strings of memory cells, wherein each string of the plurality of strings comprises:
   a first group of memory cells coupled to a first group of access lines, the first group of memory cells corresponding to a first erase block having a first programming characteristic such that the memory array comprises a plurality of first erase blocks respectively corresponding to the plurality of strings; and
   a second group of memory cells coupled to a second group of access lines, the second group of memory cells corresponding to a second erase block having a second programming characteristic such that the memory array comprises a plurality of second erase blocks respectively corresponding to the plurality of strings; and
   writing the data sequentially to the first erase blocks of the plurality of strings and the second erase blocks of the plurality of strings in an interleaved manner by:
   writing a first portion of the data to one or more first erase blocks of the first erase blocks over a first time period; and
   writing, responsive to the first time period being expired and to continue to write the data to the memory array, a second portion of the data to one or more second erase blocks of the second erase blocks over a second time period, wherein at least one first erase block of the one or more first erase blocks and at least one second erase block of the one or more second erase blocks are part of a same physical block of the plurality of strings.

2. The method of claim 1, wherein writing the first portion of the data to the one or more first erase blocks further comprises writing the first portion of the data to a first page of the one or more first erase blocks.

3. The method of claim 2, wherein writing the second portion of the data to the one or more second erase blocks further comprises writing, subsequent to writing the first portion of the data to the first page of the one or more first erase blocks, the second portion of the data to a first page of the one or more second erase blocks.

4. The method of claim 3, wherein the first page of the one or more first erase blocks and the first page of the one or more second erase blocks correspond to a super page of a first super block whose constituent pages are distributed among a plurality of erase blocks of the memory array.

5. The method of claim 3, further comprising writing, subsequent to writing the second portion of the data to the first page of the one or more second erase blocks, a third portion of the data to a second page of the one or more first erase blocks.

6. The method of claim 1, further comprising writing, responsive to the second time period being expired, a third portion of the data to the one or more first erase blocks.

7. An apparatus, comprising:
   a memory array comprising a plurality of strings of memory cells, wherein each string of the plurality of strings comprises:

a first group of memory cells coupled to a first group of access lines and corresponding to a first erase block having a first programming characteristic such that the memory array comprises a plurality of first erase blocks respectively corresponding to the plurality of strings; and a second group of memory cells coupled to a second group of access lines and corresponding to a second erase block having a second programming characteristic such that the memory array comprises a plurality of second erase blocks respectively corresponding to the plurality of strings; and a controller coupled to the memory array and configured to:

receive data corresponding to a sequence of write commands;

write a first portion of the data to one or more first erase blocks of the plurality of first erase blocks over a first time period; and write, in response to expiration of the first time period and to write the data sequentially to the plurality of first erase blocks and the plurality of second erase blocks in an interleaved manner, a second portion of the data to one or more second erase blocks of the plurality of second erase blocks over a second time period, wherein at least one first erase block of the one or more first erase blocks and at least one second erase block of the one or more second erase blocks are part of a same physical block of the plurality of strings.

8. The apparatus of claim 7, wherein:

the plurality of first erase blocks and the plurality of second erase blocks are organized as one or more super erase blocks; and each super erase block of the one or more super erase blocks comprises respective first erase blocks of the plurality of first erase blocks and respective second erase blocks of the plurality of the second erase blocks from a plurality of logical units (LUNs) in an interleaved manner.

9. The apparatus of claim 8, wherein:

a first super erase block of the one or more super erase blocks comprises:

one or more first erase blocks of a first LUN of the plurality of LUNs; and one or more second erase blocks of a second LUN of the plurality of LUNs; and a second super erase block of the one or more super erase blocks comprises:

one or more second erase blocks of the first LUN; and one or more first erase blocks of the second LUN.

10. The apparatus of claim 8, wherein:

the memory array is one of a plurality of memory arrays; and each LUN of the plurality of LUNs comprises one or more memory arrays of the plurality of memory arrays.

11. The apparatus of claim 7, wherein the memory array further comprises a third group of access lines located between the respective first groups of access lines and the respective second groups of access lines.

12. The apparatus of claim 11, wherein the third group of access lines are dummy access lines coupled to memory cells that are not used to store user data.

13. The apparatus of claim 7, wherein the controller is configured to:

write a third portion of the data to one or more first erase blocks of the plurality of first erase blocks subsequent to the second portion of the data being written to the one or more second erase blocks; and write a fourth portion of the data to one or more second erase blocks of the plurality of second erase blocks subsequent to the third portion of the data being written to the one or more first erase blocks.

14. The apparatus of claim 7, wherein a data transfer rate corresponding to the first programming characteristic is faster than a data transfer rate corresponding to the second programming characteristic.

15. An apparatus, comprising:

a memory array comprising a plurality of strings of memory cells, wherein each string of the plurality of strings comprises:

a first group of memory cells coupled to a first group of access lines and corresponding to a first erase block having a first programming characteristic such that the memory array comprises a plurality of first erase blocks respectively corresponding to the plurality of strings; and a second group of memory cells coupled to a second group of access lines and corresponding to a second erase block having a second programming characteristic such that the memory array comprises a plurality of second erase blocks respectively corresponding to the plurality of strings; and a controller coupled to the memory array and configured to:

receive data corresponding to a sequence of write commands to write the data to the memory array;

write a first portion of data corresponding to the sequence of write commands to one or more first erase blocks of the plurality of first erase blocks over a first time period; and write, responsive to expiration of the first time period, a second portion of the data to one or more second erase blocks of the plurality of second erase blocks over a second time period, wherein at least one first erase block of the one or more first erase blocks and at least one second erase block of the one or more second erase blocks are part of a same physical block of the plurality of strings.

16. The apparatus of claim 15, wherein the controller is further configured to:

write, responsive to the second time period being expired, a third portion of the data to one or more first erase blocks of the plurality of first erase blocks over a third time period; and write, responsive to the third time period being expired, a fourth portion of the data to one or more second erase blocks of the plurality of second erase blocks over a second time period.

17. The apparatus of claim 15, wherein the controller is further configured to:

write the first portion of data corresponding to the sequence of write commands to the one or more first erase blocks over the first time period further by writing the first portion of the data sequentially to pages of the one or more first erase blocks over the first time period; and write the second portion of the data to the one or more second erase blocks over the second time period further by writing the second portion of the data sequentially to pages of the one or more second erase blocks over the second time period responsive to the expiration of the first time period.

18. The apparatus of claim 15, wherein the plurality of first groups of access lines corresponding to the plurality of first erase blocks are physically separated from the second plurality of groups of access lines corresponding to the plurality of second erase blocks by a number of access lines coupled to memory cells that are not used to store data.

* * * * *